(12) United States Patent
Kinsman

(10) Patent No.: US 6,380,630 B1
(45) Date of Patent: *Apr. 30, 2002

(54) VERTICAL SURFACE MOUNT PACKAGE UTILIZING A BACK-TO-BACK SEMICONDUCTOR DEVICE MODULE

(75) Inventor: Larry D. Kinsman, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/643,357

(22) Filed: Aug. 22, 2000

Related U.S. Application Data

(63) Continuation of application No. 09/052,197, filed on Mar. 31, 1998, now Pat. No. 6,147,411.

(51) Int. Cl.$^7$ ................................ H01L 23/48
(52) U.S. Cl. ............... 257/777; 257/724; 257/780; 257/783; 257/786
(58) Field of Search .................. 257/724, 726, 257/727, 737, 738, 777, 780, 781, 779, 782, 783, 723, 786; 438/109, 110; 228/180.22

(56) References Cited

U.S. PATENT DOCUMENTS

| | | | |
|---|---|---|---|
| 5,259,793 A | 11/1993 | Yamada et al. ............ 439/637 |
| 5,291,061 A | 3/1994 | Ball ........................... 257/686 |
| 5,323,060 A | 6/1994 | Fogal et al. ................ 257/777 |
| RE34,794 E | 11/1994 | Farnworth .................. 257/678 |
| 5,362,986 A | 11/1994 | Angiulli et al. ............ 257/723 |
| 5,397,747 A | 3/1995 | Angiulli et al. ............ 438/109 |
| 5,444,304 A | 8/1995 | Hara et al. ................. 257/796 |
| 5,450,289 A | 9/1995 | Kweon et al. .............. 361/773 |
| 5,451,815 A | 9/1995 | Taniguchi et al. .......... 257/692 |
| 5,567,654 A | 10/1996 | Beilstein, Jr. et al. ......... 438/4 |
| 5,574,310 A | 11/1996 | Sono et al. ................. 257/696 |
| 5,592,019 A | 1/1997 | Ueda et al. ................. 257/666 |
| 5,593,927 A | 1/1997 | Farnworth et al. .......... 438/113 |
| 5,635,760 A | 6/1997 | Ishikawa .................... 257/692 |
| 5,661,901 A | 9/1997 | King ............................. 29/830 |
| 5,668,409 A | 9/1997 | Gaul .......................... 257/723 |
| 5,714,802 A | 2/1998 | Cloud et al. ................ 257/726 |
| 5,767,443 A | 6/1998 | Farnworth et al. ........... 174/50 |
| 5,793,116 A | 8/1998 | Rinne et al. ................ 257/777 |
| 5,801,448 A | 9/1998 | Ball ........................... 257/778 |
| 5,965,933 A | 10/1999 | Young et al. ............... 257/621 |
| 6,007,357 A | 12/1999 | Perino et al. ............... 439/327 |
| 6,147,411 A * | 11/2000 | Kinsman ..................... 257/777 |
| 6,191,474 B1 | 2/2001 | Kinsman et al. ............ 257/693 |

FOREIGN PATENT DOCUMENTS

JP 6-77392 3/1994

* cited by examiner

Primary Examiner—Olik Chaudhuri
Assistant Examiner—Alonzo Chambliss
(74) Attorney, Agent, or Firm—TraskBritt

(57) ABSTRACT

A back-to-back semiconductor device module including two semiconductor devices, the backs of each being secured to one another. The bond pads of both semiconductor devices are disposed adjacent a single, mutual edge of the device module. The device module may be secured to a carrier substrate in a substantially perpendicular orientation relative to the former. Solder reflow or a module-securing device can secure the device module to the carrier substrate. An embodiment of a module-securing device comprises an alignment device having one or more receptacles formed therein and intermediate conductive elements that are disposed within the receptacles to establish an electrical connection between the semiconductor devices and the carrier substrate. Another module-securing device comprises a clip-on lead, where one end resiliently biases against a lead of at least one of the semiconductor devices, while the other end connects electrically to a carrier substrate terminal.

20 Claims, 6 Drawing Sheets

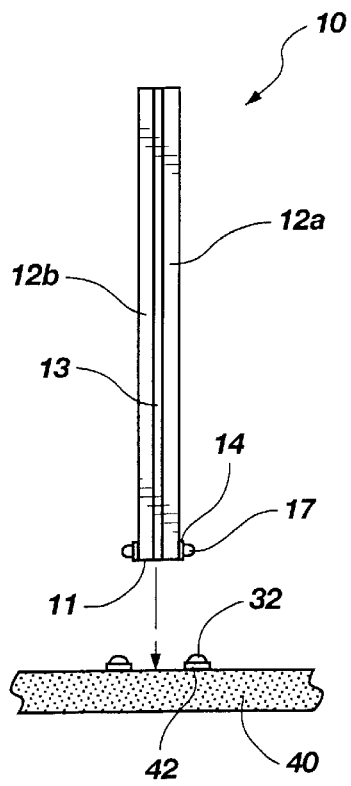
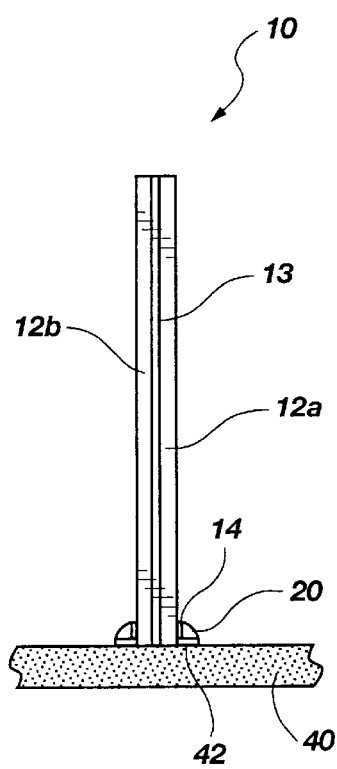
*Fig. 3a*  *Fig. 3b*
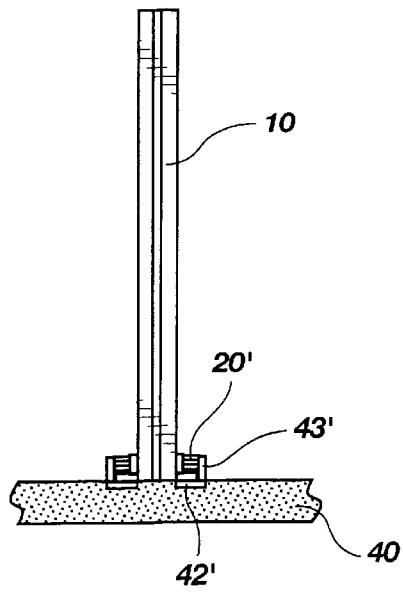
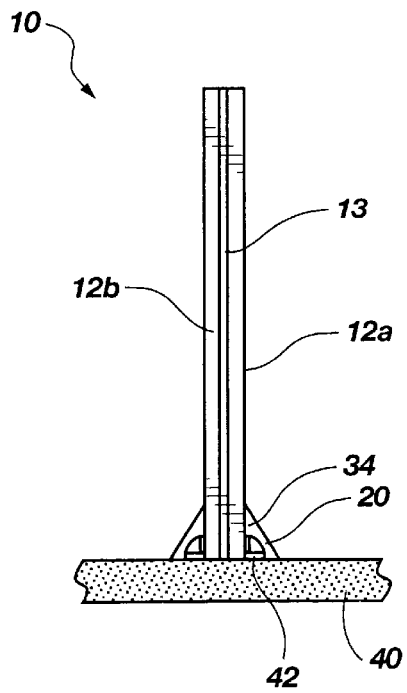
*Fig. 3c*  *Fig. 4*

VERTICAL SURFACE MOUNT PACKAGE UTILIZING A BACK-TO-BACK SEMICONDUCTOR DEVICE MODULE

CROSS-REFERENCE TO RELATED APPLICATIONS

This application is a continuation of application Ser. No. 09/052,197, filed Mar. 31, 1998, now U.S. Pat. No. 6,147, 411.

BACKGROUND OF THE INVENTION

1. Field of the Invention

The present invention relates to multi-chip modules and, more specifically, to multi-chip modules including semiconductor devices that are mounted to one another in a back-to-back relationship. The present invention also relates to chip-on-board assemblies. Particularly, the present invention relates to bare and minimally packaged semiconductor devices which are mountable substantially perpendicularly to a carrier substrate such as a printed circuit board. All of the bond pads of the semiconductor devices are disposed proximate a single edge or side thereof. The present invention also relates to methods and devices for securing back-to-back mounted semiconductor devices perpendicularly relative to a carrier substrate and for establishing electrical connections between the semiconductor devices and the carrier substrate to fabricate a multi-chip module.

2. Background of Related Art

The direct attachment of an unpackaged semiconductor device to a circuit board is known in the art as chip-on-board technology. Semiconductor devices that are directly (i.e., without packaging) mountable to a circuit board typically include peripherally disposed bond pads that are adjacent more than one edge thereof or in an area array over the active surface of the semiconductor device. Methods for attaching unpackaged or minimally packaged (such as the so-called "chip scale package") semiconductor devices directly to a circuit board include wire bonding, flip-chip technology and tape automated bonding. Typically, when such techniques are employed, a semiconductor device (typically a singulated semiconductor die) which includes bond pads on an active surface thereof is oriented over the circuit board, either active surface up or active surface down, and substantially parallel thereto, in order to establish an electrical connection between the semiconductor device and the circuit board by one of the aforementioned techniques. After electrically connecting such a semiconductor device to a circuit board, a protective coating may be applied over the semiconductor device.

However, the active surface-down placement of a semiconductor device directly against a circuit board is somewhat undesirable in that, due to the substantially parallel orientation of the semiconductor device relative to the circuit board and the location of an integrated circuit on the active surface of the semiconductor device against the circuit board, heat must pass through the circuit board or through the substrate of the semiconductor device in order to dissipate from the active surface of the semiconductor device. Thus, the transfer of heat away from the semiconductor device is relatively slow and may result in the generation of damaging ambient temperatures at the active surface during prolonged operation of the semiconductor device. A horizontal (parallel) orientation of the semiconductor device relative to the circuit board also causes the semiconductor device to consume a great deal of area or "real estate" on the circuit board. Moreover, conventional chip-on-board attachments as previously referenced are typically permanent, making them somewhat undesirable from the standpoint that they are not readily user-upgradable by substitution of different, higher-performance semiconductor devices.

Various multi-chip module arrangements have been developed to conserve "real estate" on a carrier substrate. Some multi-chip modules include a plurality of mutually parallel bare semiconductor devices that are secured in a stack, one above another. The semiconductor devices of stacked multi-chip modules are typically substantially parallel to the carrier substrate to which they are secured. Multi-chip modules with vertically oriented dice are also known. Exemplary device stack arrangements are described in the following U.S. Pat. No. : 5,291,061, issued to Ball on Mar. 1, 1994; and U.S. Pat. No. 5,323,060 issued to Fogal et al. on Jun. 21, 1994. Exemplary vertical dice arrangements are described in U.S. Pat. No. 5,362,986, issued to Angiulli et al. on Nov. 8, 1994; and U.S. Pat. No. 5,397,747, issued to Angiulli et al. on Mar. 14, 1995.

While multi-chip modules successfully conserve some of the "real estate" on a carrier substrate, the horizontal (i.e., substantially parallel to the carrier substrate) orientation of some such devices still consumes a significant area thereof. Moreover, the stacking of many such semiconductor devices inhibits the dissipation of heat from the devices of the stack, which may, as noted above, adversely affect the performance of the semiconductor devices, and may even damage them. Finally, many known multi-chip modules are electrically connected to a carrier substrate with solder or other permanent means, such as wire bonds or TAB (tape automated bonding or flex circuit) connections, and are also permanently mechanically attached by solder, epoxy or another bonding agent. Thus, such semiconductor devices are not readily removable from the carrier substrate or readily replaceable thereupon (i.e., they are not user-upgradable).

Similarly, vertical surface mount packages are known in the art. When compared with traditional, horizontally mountable semiconductor packages and chip-on-board devices, many vertical surface mount packages have a superior ability to transfer heat away from the semiconductor device due to exposure of both major surfaces of the package. Vertical surface mount packages also consume less area on a circuit board than a horizontally mounted package of the same size. Thus, many skilled individuals in the semiconductor industry are finding vertical surface mount packages more desirable than their traditional, horizontally mountable counterparts. The following United States Patents disclose various exemplary vertical surface mount packages: U.S. Pat. No. Re. 34,794, issued to Warren M. Farnworth on Nov. 22, 1994; U.S. Pat. No. 5,444,304, issued to Kouija Hara and Jun Tanabe on Aug. 22, 1995; U.S. Pat. No. 5,450,289, issued to Yooung D. Kweon and Min C. An on Sep. 12, 1995; U.S. Pat. No. 5,451,815, issued to Norio Taniguchi et al. on Sep. 19, 1995; U.S. Pat. No. 5,592,019, issued to Tetsuya Ueda et al. on Jan. 7, 1997; and U.S. Pat. No. 5,635,760, issued to Toru Ishikawa on Jun. 3, 1997.

Many vertical surface mount packages are somewhat undesirable in that they include leads which operatively connect a semiconductor device to a circuit board. The leads of such devices tend to increase the impedance and decrease the overall speed with which such devices conduct electrical signals. Moreover, the required packaging of many such devices adds to their undesirability. Typically, packaging requires multiple additional materials and manufacturing steps, which translate into increased production costs, which are further increased due to the potential for package and connection defects and resulting lower final yields. The packaging of many vertical surface mount packages, and thus thickness in excess of that of the packaged die, also tends to consume additional area or "real estate" on the circuit board to which they are attached. Further, the materials of most semiconductor device packages tend to inhibit the transfer of heat from the semiconductor device contained therein. Moreover, many vertical surface mount packages are not readily user-upgradable due to permanent connections to the carrier substrate.

Accordingly, the inventor has recognized a need for a semiconductor device configuration that has low impedance, provides improved heat transfer and conserves "real estate" on a carrier substrate. There is also a need for user-upgradable semiconductor devices, which is addressed by some embodiments of the invention.

BRIEF SUMMARY OF THE INVENTION

The back-to-back semiconductor device module according to the present invention addresses each of foregoing needs.

The back-to-back semiconductor device module of the present invention includes two semiconductor devices, each having a plurality of bond pads disposed proximate a single edge thereof. The back surfaces, or bases, of the adjoined semiconductor devices are bonded together with an adhesive material to form the back-to-back semiconductor device module. The bond pads of each semiconductor device are positioned adjacent a mutual or common edge of the semiconductor device module.

The present invention also includes methods and devices for securing the back-to-back semiconductor device module substantially perpendicular relative to a carrier substrate.

An embodiment of a method for securing the module substantially perpendicular to a carrier substrate employs the disposition of solder bricks on the terminals of the carrier substrate that correspond to the locations of the bond pads of the semiconductor devices of the module and the use of solder reflow techniques to establish an electrically conductive joint therebetween.

An embodiment of a module-securing element that orients the module substantially perpendicular to the carrier substrate comprises an alignment device including one or more receptacles having a plurality of intermediate conductive elements therein. Upon insertion of the module into the socket, the intermediate conductive elements establish an electrical connection between bond pads of each of the semiconductor devices and their corresponding terminals or traces on the carrier substrate.

Another embodiment of a module-securing element for orienting the module substantially perpendicularly relative to a carrier substrate includes a leaf spring clip-on lead that establishes a biased, interference-type electrical connection with a bond pad on at least one of the semiconductor devices and a conductive extension which may be electrically connected to a corresponding terminal or trace on the carrier substrate.

The present invention also includes assemblies wherein the back-to-back semiconductor device module of the present invention is oriented substantially perpendicular to a carrier substrate with conductive joints, with an alignment device, with clip-on leads, or with another electrically conductive element. An electronic system with which the back-to-back semiconductor device module is associated is also within the scope of the present invention.

Advantages of the present invention will become apparent to those of ordinary skill in the art through a consideration of the appended drawings and the ensuing description.

BRIEF DESCRIPTION OF THE SEVERAL VIEWS OF THE DRAWINGS

FIGS. 3a and 3b are side plan views that illustrate a method of securing the back-to-back semiconductor device module of FIG. 1 to a carrier substrate with support joints;

FIG. 3c is a side plan view which illustrates a variation of the support joints of FIGS. 3a and 3b;

FIG. 4 is a side plan view depicting the use of support joints in connection with the module-carrier substrate assembly formed by the method of FIG. 3;

FIG. 10b is a frontal plan view of a variation of the embodiment of FIG. 10a;

DETAILED DESCRIPTION OF THE INVENTION

Figure 1:
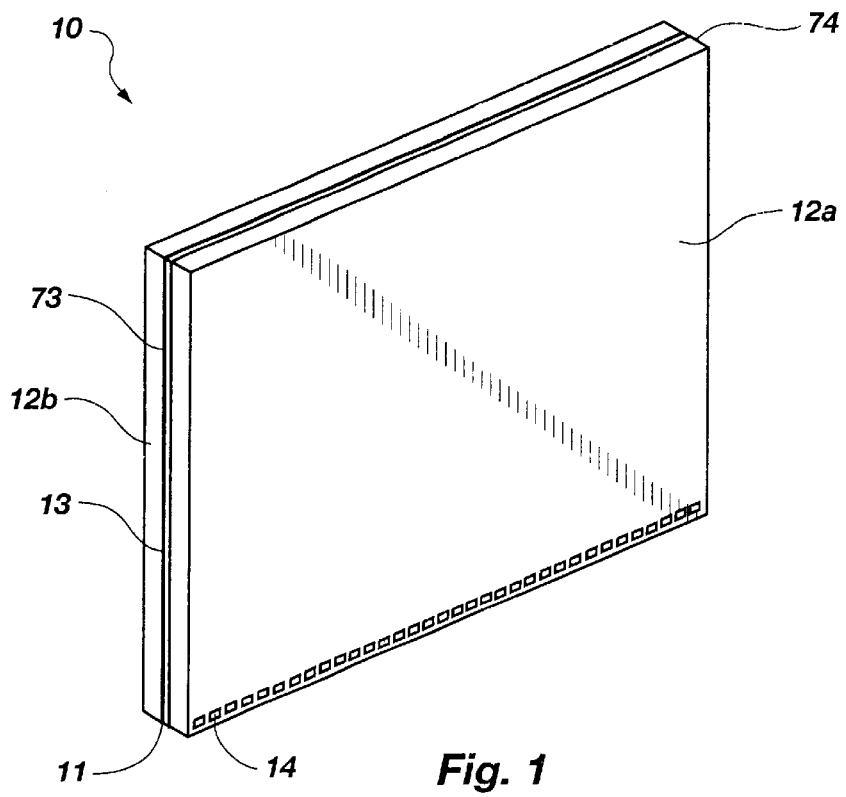
FIG. 1 is a perspective view of a back-to-back semiconductor device module according to the present invention.

With reference to FIG. 1, a back-to-back semiconductor device module 10, sometimes termed a "module" for simplicity, includes a first semiconductor device 12a, a second semiconductor device 12b, and an intervening securing element 13. Semiconductor devices 12a and 12b may each comprise a semiconductor die. Module 10 secures to a carrier substrate (not shown), such as a printed circuit board (PCB), in a substantially perpendicular orientation and electrically connects thereto. Module 10 may be secured directly to the carrier substrate 40 with conductive joints 20 (see FIGS. 3b and 4), inserted into an alignment device 50 (see FIG. 5), or electrically attached to clip-on leads 85 that are secured to terminals 42 of the carrier substrate (see FIG. 10a).

Figure 2:
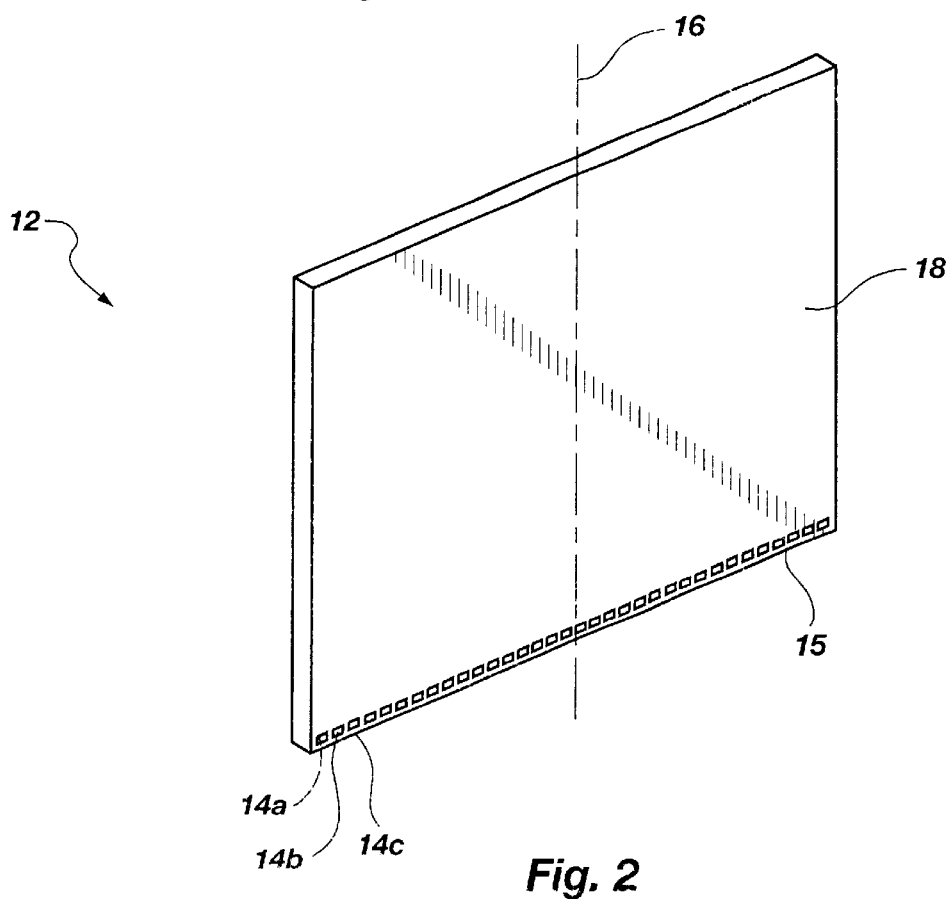
FIG. 2 is a frontal perspective view of a semiconductor device that is useful in the back-to-back semiconductor device module of FIG. 1.

Referring to FIG. 2, each semiconductor device 12a, 12b is generally of a type known in the industry, and includes circuit traces and associated active elements carried on an active surface 18 thereof, which traces and elements are typically collectively referred to as integrated circuitry. Semiconductor device 12a includes bond pads 14a, 14b, 14c, etc. that are disposed on an active surface 18 of the same, electrically connected with the integrated circuitry thereof, and located adjacent a single peripheral edge 15 thereof. Preferably, bond pads 14a, 14b, 14c, etc. are arranged in-line, parallel to the adjacent edge and substantially equally spaced therefrom. Bond pads 14 may be disposed a short distance from edge 15, or their lower edges may be flush with the edge. Thus, during fabrication of semiconductor device 12a, bond pads 14a, 14b, 14c, etc. are redirected for use in the invention by an additional step or steps to a location which is proximate edge 15 if the bond pad layout of semiconductor device 12a does not already suitably locate the bond pads. Processes which are known to those of ordinary skill in the art are useful for fabricating modified semiconductor devices 12 that are useful in the module 10 according to the present invention. Such processes include the formation of input and output circuit traces which lead from original, central bond pad locations to edge 15 and rerouted bond pads 14 adjacent edge 15. Preferably, the fabrication steps which precede the formation of the input/output circuit traces that lead to bond pads 14 and the formation of the bond pads are unchanged from their equivalent steps in the fabrication of prior art semiconductor devices. Thus, existing semiconductor designs are useful in the assembly of the present invention with little or no modification.

A preferred semiconductor device 12 has a standardized number of bond pads 14a, 14b, 14c, etc., which are spaced laterally from one another at a standardized space or "pitch", and which may be positioned at a specific location relative to a center line 16 of the semiconductor device or relative to any other landmark on the semiconductor device, such as a peripheral side thereof. Alternatively, the spacing and number of bond pads 14 may be non-standardized. The placement of bond pads 14 proximate edge 15 imparts semiconductor device module 10 with reduced impedance as the bond pads are electrically connected to a carrier substrate (not shown) via very short, large cross-section conductive elements, relative to many vertical surface mount packages and other packaged semiconductor devices in the prior art.

Referring again to FIG. 1, securing element 13 is disposed between semiconductor devices 12a and 12b to secure them to one another in a back-to-back configuration. Securing element 13 may include conductive or non-conductive epoxies, a thin layer polymeric film having an adhesive coating on its upper and lower surfaces (such as the adhesive polyimide film sold under the trade name KAPTON™ by E. I. du Pont de Nemours & Co. of Wilmington, Del.), room temperature vulcanizing (RTV) silicones, or other adhesive materials known in the art. Preferably, semiconductor devices 12a and 12b are secured together such that their bond pads 14 are proximate a mutual, or common, edge 11 of module 10. Semiconductor devices 12a and 12b may be secured together while each is in wafer form on separate wafers placed back-to-back, then severed through the depth of both wafers. Alternatively, semiconductor devices 12a and 12b may be secured together after the semiconductor wafers have been severed to singulate the devices. It should be noted that the invention may be practiced with partial wafers including more than one die location thereon.

Referring now to FIGS. 3a and 3b, a method of direct electrical attachment of the back-to-back semiconductor device module 10 of the present invention includes the use of conductive joints to secure the semiconductor devices 12a and 12b to a carrier substrate 40 and establish an electrical connection between the corresponding substrate and the semiconductor devices. Preferably, as shown in FIG. 3a, the bond pads 14 of each semiconductor device 12a and 12b may each include a bump 17 formed thereon. Bumps 17 are preferably formed from gold, gold alloy, or solder by techniques which are known in the art.

With continued reference to FIG. 3a, a brick or pellet of solder paste 32 is disposed on each terminal 42 of carrier substrate 40. Typically, solder paste 32 is a mixture of solder powder, flux and a binder which keeps the solder powder and flux together. The preferred solder paste 32 and bump 17 materials have matched impedance to ensure optimum conditions for the transfer of electrical signals from carrier substrate 40 to semiconductor devices 12a and 12b and from the semiconductor devices to the carrier substrate. Preferably, solder paste 32 is applied to terminals 42 by techniques which are known in the art, including, without limitation, screen printing, stencil printing, pressure dispensing, and the use of solder preforms.

As module 10 is positioned on carrier substrate 40, each bump 17 contacts a brick of solder paste 32. Bump 17 and solder paste 32 are then fused together to form a solder joint, which is also referred to as a module-securing element or a module-securing device, as an electrically conductive joint or as a conductive joint 20. Referring to FIG. 3b, conductive joint 20 physically supports module 10 relative to carrier substrate 40 in a substantially perpendicular orientation with respect thereto, and electrically connects bond pads 14 to their corresponding terminals 42. Preferably, known solder reflow techniques are employed to form conductive joint 20. Solder reflow techniques include, but are not limited to, vapor-phase, infrared, hot gas, and other solder reflow methods. Other known soldering techniques may also be useful for fusing bump 17 and solder paste 32 to electrically connect bond pad 14 to terminal 42. Alternatively, as shown in FIG. 3c, a conductive joint 20' may be formed by placing a connector of electrically conductive or conductor-filled epoxy or any other conductive element, including without limitation electrically conductive anisotropic (so-called z-axis) elastomers, in contact with both bond pad 14 and terminal 42'. Terminal 42' includes an upwardly extending component 43' so that an electrical connection may be established with bond pad 14 by a z-axis elastomer which includes conductors that run parallel to carrier substrate 40.

Referring now to FIG. 4, one or more non-conductive support joints 34, which are also referred to as support footings or support members, may be placed along edge 11 between conductive joints 20, and between module 10 and carrier substrate 40 to impart additional structural stability to the module. Alternatively, a continuous bead of such material may be applied over all conductive joints 20 for enhanced support and environmental protection. Preferably, support joints 34 are formed from materials such as epoxy potting compounds, acrylic compounds, silicone materials, resinous molding compounds, or other polymeric plastic materials which are known in the art. Preferably, the amount of material that is used to form each support joint 34 is sufficient to support module 10, yet minimal in order to optimize the transfer of heat away from semiconductor devices 12a and 12b and preserve surface area (or "real estate") on carrier substrate 40.

Figure 5:
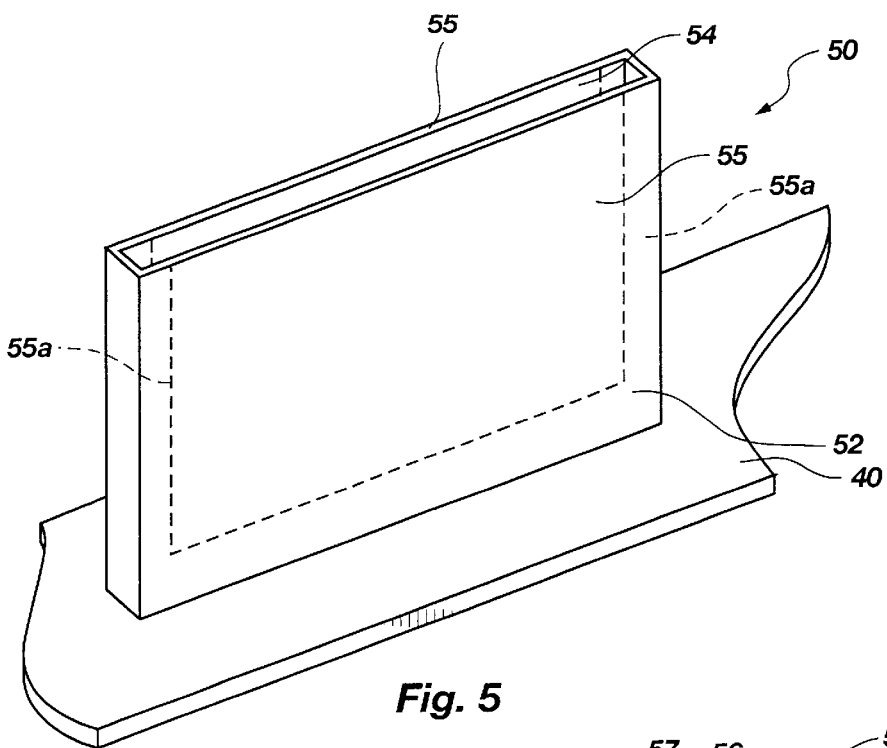
FIG. 5 is a perspective view of an embodiment of a module-securing device according to the present invention.

Alternatively, as shown in FIG. 5, module 10 (see FIG. 1) may be secured to carrier substrate 40 with another embodiment of a module-securing device, which is referred to as an alignment device 50. Alignment device 50 may comprise a base 52 and side walls 55 that define one or more receptacles 54 therebetween, extending substantially downward from the top of the alignment device to carrier substrate 40. Side walls 55 facilitate the proper alignment of module 10 as it is inserted into receptacle 54. Preferably, base 52 is fixedly mounted to carrier substrate 40 with protrusions which extend into or through the carrier substrate, adhesives, epoxies, solders, or other substrate attachment components and processes known in the art. As shown in broken lines in FIG. 5, alignment device 50 may include cut-out side walls 55a defining side edge slots to receive and align module 10 while facilitating heat transfer away from the exterior active surfaces of devices 12a and 12b.

Figure 6A:
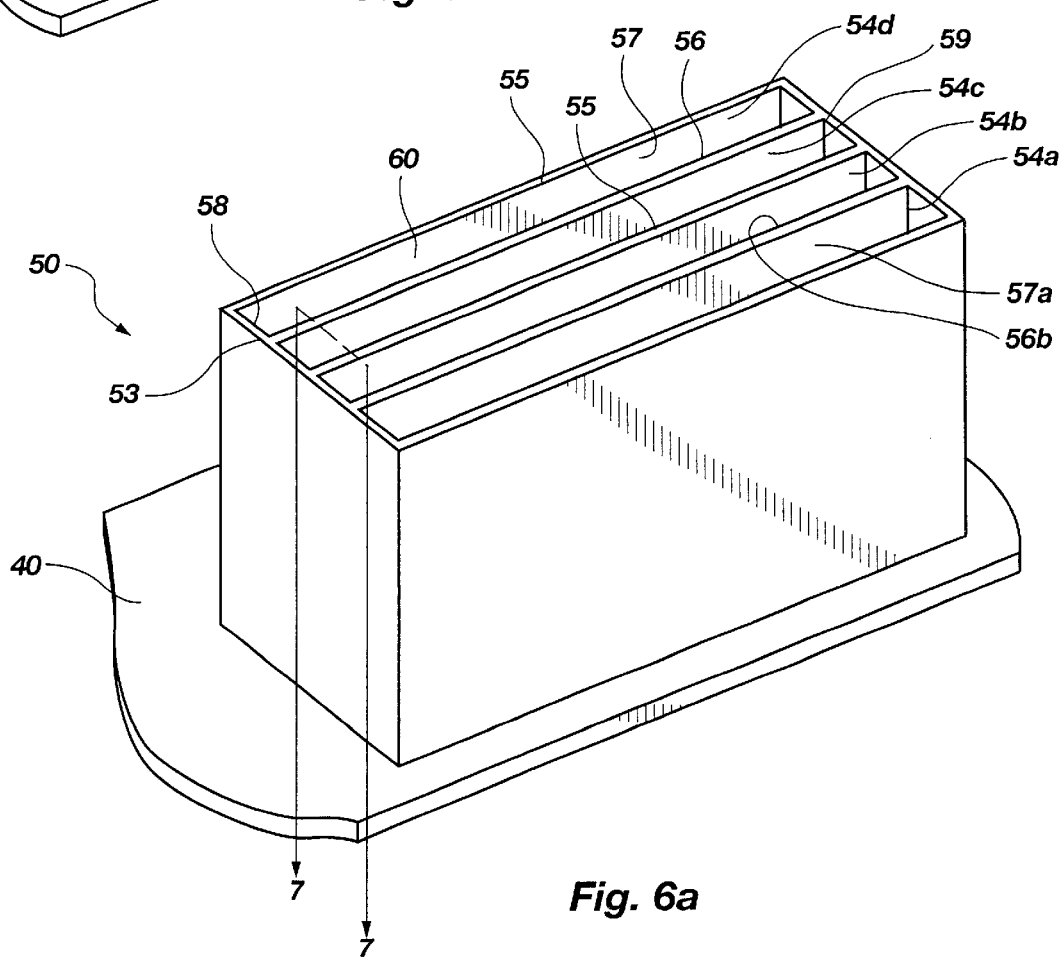
FIG. 6a is a perspective view of a variation of the module-securing device illustrated in FIG. 5.
Figure 7:
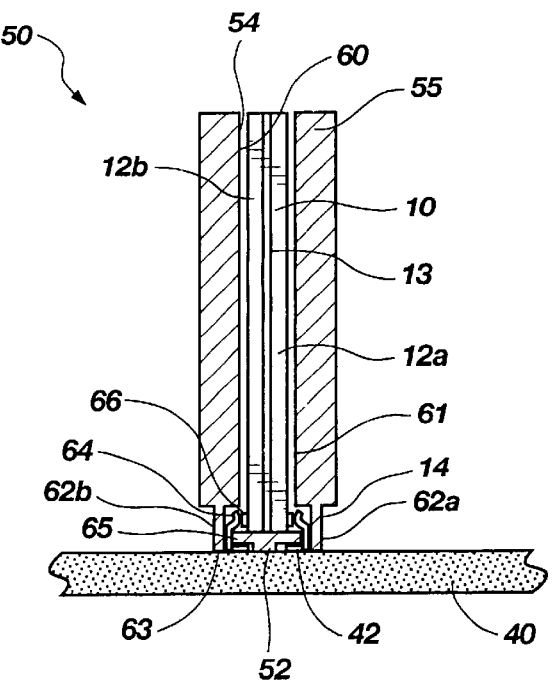
FIG. 7 is a cross-section taken along line 7—7 of FIG. 6a, depicting an assembly including the back-to-back semiconductor device module of FIG. 1, the module-securing device of FIG. 6a and a carrier substrate, and illustrating the biasing of the intermediate conductive elements against bond pads of the semiconductor devices.

FIGS. 6a and 7 illustrate a variation of alignment device 50 which includes a plurality of receptacles 54. Receptacles 54 each include two sides 56 and 57 and two ends 58 and 59. Preferably, in embodiments of alignment device 50 which include more than one receptacle 54a, 54b, 54c, 54d, etc., each of the receptacles is arranged in a mutually parallel relationship, such that side 57a of one receptacle 54a is adjacent to side 56b of the next receptacle 54b. Preferably, sides 56 and 57 are slightly longer than the width of the module 10 (see FIG. 1) that is to be inserted therein. Similarly, ends 58 and 59 are slightly wider than the overall thickness of module 10. Thus, the lengths of sides 56, 57 and ends 58, 59 facilitate insertion of module 10 into receptacle 54 and removal of the same from the receptacle by providing clearance between the module and the sides and ends of the receptacle. Each receptacle 54 also has an upper end 60, which opens to the top surface 53 of alignment device 50, and a lower end 61. Module 10 (see FIG. 1) inserts into receptacle 54 through upper end 60.

Figure 6B:
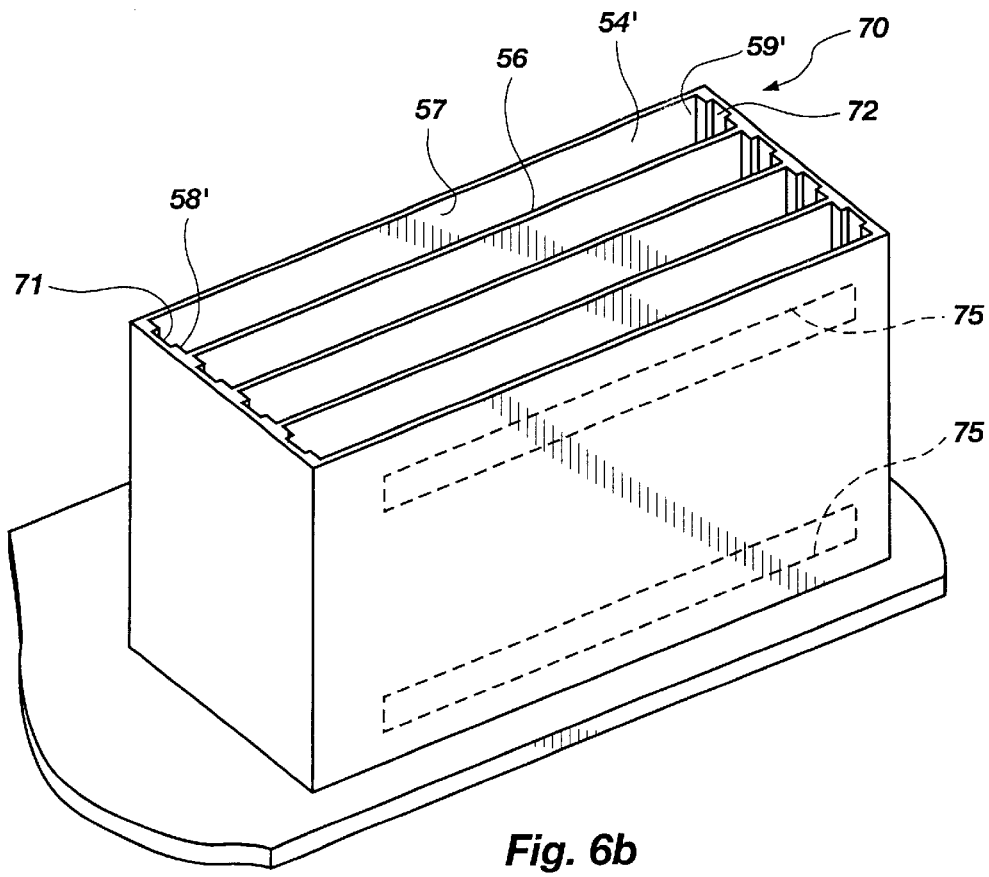
FIG. 6b is a perspective view of another variation of the module-securing device illustrated in FIG. 5.

Referring now to FIG. 6b, each receptacle 54' may also include an alignment mechanism 70. A preferred embodiment of alignment mechanism 70 includes guide slots 71 and 72, formed within ends 58' and 59', respectively. Guide slots 71 and 72 may extend from the upper end of receptacle 54' and at least partially down ends 58' and 59', respectively. Guide slots 71 and 72 are adapted to engage a corresponding edge of the module 10 (edges 73 and 74, respectively, shown in FIG. 1).

Two rows of upwardly extending intermediate conductive elements 62a and 62b, each row including one or more intermediate conductive elements 62, are disposed within lower end 61 of receptacle 54. FIG. 7 illustrates a preferred embodiment of an intermediate conductive element 62. Each intermediate conductive element 62 is a leaf spring which extends through base 52 of alignment device 50 to connect to a corresponding terminal 42 of carrier substrate 40. Intermediate conductive element 62 includes a terminal contact end 63, a bond pad contact end 64, and a spring arm 65 adjoining the terminal contact end 63 and the bond pad contact end 64. Preferably, terminal contact end 63, spring arm 65 and bond pad contact end 64 are formed integrally with one another. Each terminal contact end 63 is electrically connected to a corresponding terminal 42 associated with a trace on carrier substrate 40. During the insertion of a module 10 (see FIG. 1) into receptacle 54, spring arm 65 is forced away from the module. The reactive (i.e., spring) force of spring arm 65 resiliently biases bond pad contact end 64 against its corresponding bond pad 14 (see FIG. 1) in order to establish an electrical connection therewith. Thus, intermediate conductive element 62 establishes an electrical connection between carrier substrate 40 and one of the semiconductor devices 12a, 12b of module 10.

Preferably, bond pad contact end 64 is bent in an arcuate slope with a convex, inwardly-facing surface to form an outward extension 66. Outward extension 66 facilitates movement of bond pad contact end 64 as a module 10 (see FIG. 1) is inserted into receptacle 54. The shape of outward extension 66 may also prevent damage to the semiconductor devices 12a and 12b and their bond pads 14 during insertion of module 10 into receptacle 54.

Preferably, alignment device 50 is manufactured from a material which maintains its shape and rigidity at the relatively high temperatures that may be generated during the operation of a semiconductor device. A material which has good thermal conductivity properties and which may be formed into thin layers is also preferable. Materials including, without limitation, ceramics, glasses, and low electrostatic discharge (ESD) injection molded plastics are useful for manufacturing alignment device 50.

Referring again to FIG. 6b, sides 56 and 57 of alignment device 50 may also be slotted or otherwise perforated to form apertures 75, as shown in broken lines, which enhance the transfer of heat from semiconductor devices 12 that are disposed within receptacles 54.

Figure 8A:
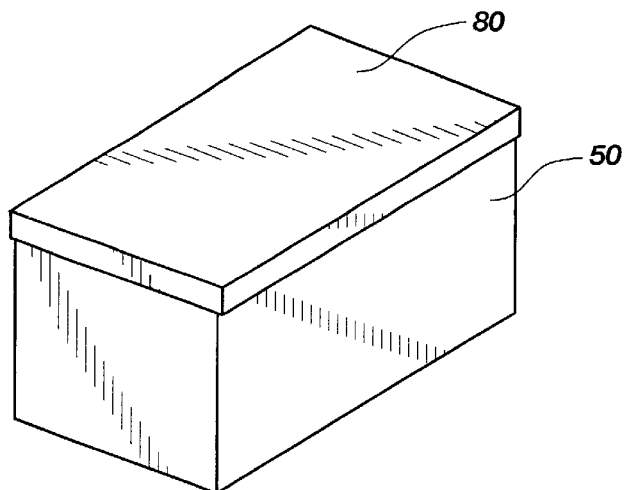
FIGS. 8a and 8b are perspective views illustrating covers that may be used on the module-securing device depicted in FIGS. 6a and 6b.
Figure 8B:
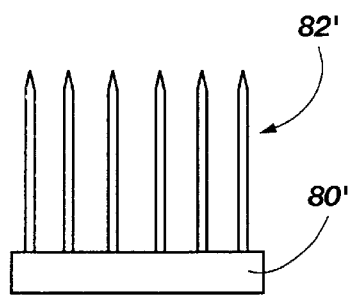

With reference to FIGS. 8a and 8b, alignment device 50 may also include a cover 80. Preferably, cover 80 is a removable member which prevents dust and debris from entering receptacles 54 (see FIG. 5) of alignment device 50 and contaminating semiconductor devices 12a and 12b (see FIG. 1). FIG. 8b depicts a cover 80' which includes a finned heat sink 82' extending from its top surface to facilitate the transfer of heat away from the semiconductor devices and the alignment device.

Figure 9A:
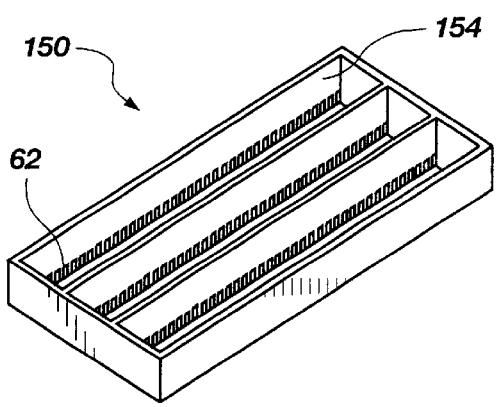
FIGS. 9a and 9b are perspective views which depict variations of the module-securing device of FIGS. 6a and 6b.
Figure 9B:
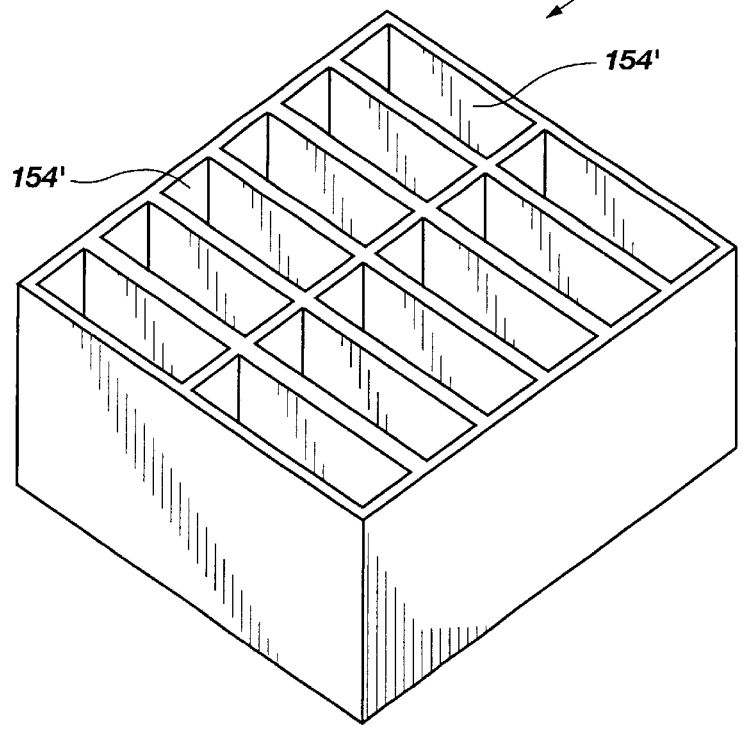

Although embodiments of alignment device 50 which include a plurality of receptacles that completely receive a module 10 (see FIG. 1) have been depicted, other embodiments of the alignment device are also within the scope of the invention. FIGS. 9a and 9b illustrate some variations of the alignment device that are useful for securing the back-to-back semiconductor device module of the present invention in a substantially perpendicular orientation relative to a carrier substrate.

FIG. 9a depicts another variation of the alignment device 150, the receptacles 154 of which only receive a bottom portion of each module 10 (see FIG. 1), and secure only bottom edge 11 of the same. FIG. 9b shows yet another variation of the alignment device 150', wherein the receptacles 154' are arranged in a matrix-type arrangement (i.e., in columns and rows). Alignment devices including combinations of these features, as well as alignment devices with other features and with combinations of the above and other features, are to be considered within the scope of the present invention.

Referring again to FIG. 7, as an example of the interconnection of module 10 and alignment device 50, module 10 is inserted into receptacle 54 through upper end 60. Side walls 55 ensure the proper alignment of bond pads 14 (see FIG. 1) with their corresponding intermediate conductive elements 62. As module 10 is inserted into receptacle 54, bond pads 14 are abutted by their respective intermediate conductive elements 62, creating a resiliently-biased, electrically conductive interference-type connection between semiconductor devices 12a and 12b and carrier substrate 40. A cover 80 (see FIGS. 8a and 8b) may then be disposed over alignment device 50.

Figure 10A:
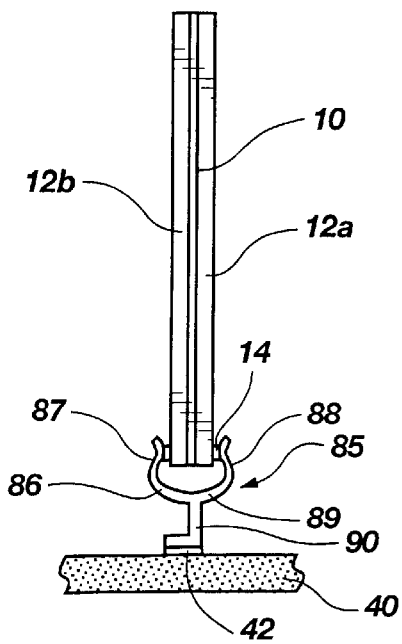
FIG. 10a is a side plan view of another embodiment of a module-securing device according to the present invention, showing a module engaged thereby and connection to a carrier substrate.

FIG. 10a shows another embodiment of a module-securing device, which is referred to as a clip-on lead 85. Clip-on lead 85 includes a bond pad contact end 86 and a terminal contact end 90. Bond pad contact end 86 includes two upwardly extending leaf springs 87, 88 which are joined by a cross-member 89. Leaf springs 87 and 88 are laterally spaced so as to permit the insertion of a module 10 therebetween. Upon insertion of module 10 between leaf springs 87, 88, one or both of the leaf springs are resiliently biased against a corresponding bond pad 14 of semiconductor devices 12a, 12b, respectively, establishing an interference-type electrical contact therewith. Such an arrangement is particularly suitable when employed with identically functional but mirror-imaged devices 12a and 12b, so that some common inputs or outputs may be shared to a single pair of connected leaf springs 87 and 88.

Figure 10C:
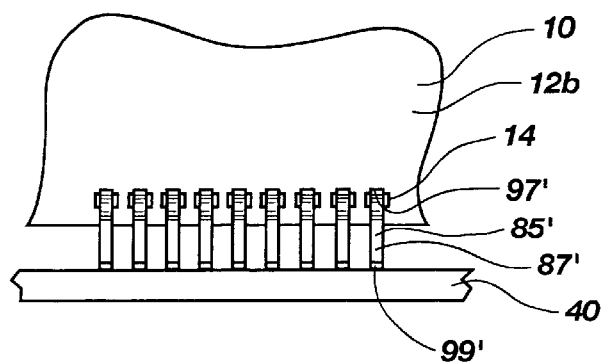
FIG. 10c is a side plan view of the variation shown in FIG. 10b.
Figure 10B:
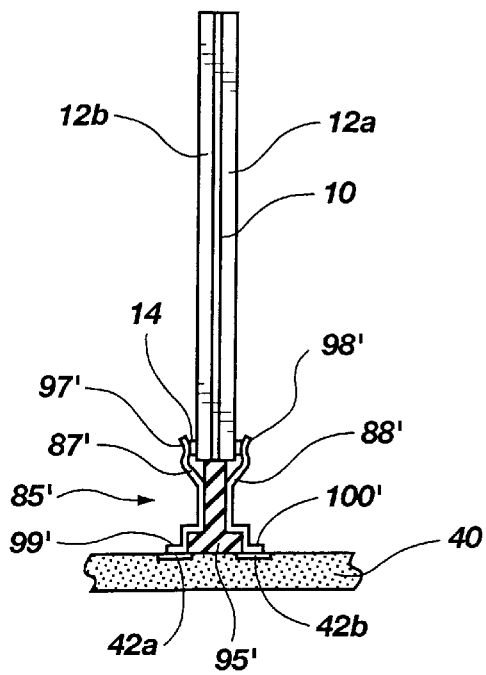

In most instances, however, a leaf spring 87 will be electrically isolated from an associated leaf spring 88, such as by mounting to opposing sides of a common base. FIGS. 10b and 10c illustrate such a variation of clip-on lead 85', wherein mirror-imaged leaf springs 87' and 88' are attached to and electrically insulated from one another by a base 95'. Each leaf spring 87', 88' includes a bond pad contact end 97', 98', respectively, and a terminal contact end 99', 100', respectively. Bond pad contact ends 97' and 98' are laterally spaced so as to permit the insertion of a module 10 therebetween. Upon insertion of module 10 between leaf springs 87' and 88', one or both of the bond pad contact ends 97', 98' are resiliently biased against a corresponding bond pad 14 of semiconductor devices 12a, 12b, respectively, establishing an interference-type electrical contact therewith.

Terminal contact ends 99' and 100' are each electrically attachable to terminal 42a, 42b of carrier substrate 40. Such an electrical connection may be established by solder, conductive epoxy, z-axis film, or any other electrically conductive bonding agent known in the art. Upon connection of module 10 with clip-on lead 85', an electrical connection is established between semiconductor device(s) 12a, 12b, terminal(s) 42a, 42b, and any external device(s) electrically connected thereto. Preferably, the clip-on leads 85' which are secured to module 10 orient the module substantially perpendicularly relative to carrier substrate 40.

Figure 11:
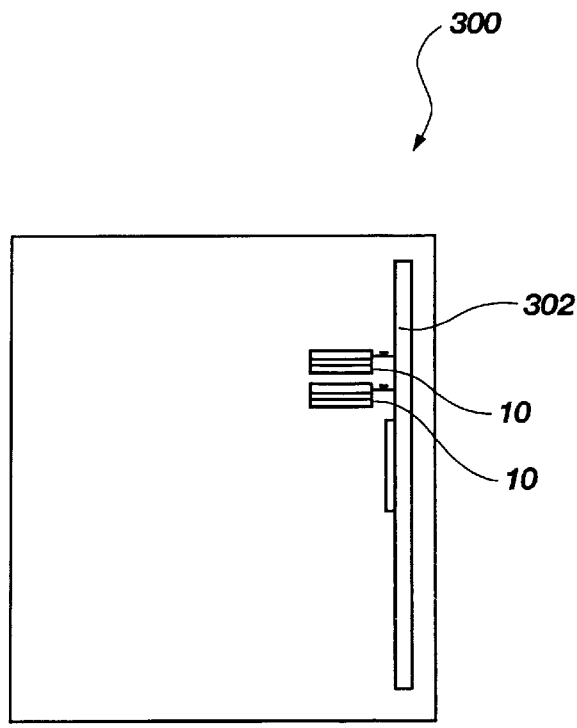
FIG. 11 is a schematic representation of an electronic system which includes the back-to-back semiconductor device module of FIG. 1.

FIG. 11 illustrates an electronic system 300, such as a computer, which includes a carrier substrate 302. Module 10 is secured to carrier substrate 302 and each of the semiconductor devices 12a and 12b thereof is electrically connected to the carrier substrate. Thus, module 10 and its semiconductor devices 12a and 12b are operatively associated with electronic system 300.

Advantageously, the bond pads of the module, which are disposed adjacent a single, mutual peripheral edge thereof, may be electrically connected to corresponding terminals on a carrier substrate with very short conductive elements exhibiting low impedance. Thus, the additional impedance that is typically generated by package leads or long electrical traces carried on the semiconductor device is significantly reduced. The placement of bond pads on the module also facilitates the substantially perpendicular securing of the module to a carrier substrate., which, when combined with a convection-type air circulation system, facilitates heat transfer away from the module.

Because the back-to-back semiconductor device module is bare or minimally packaged, the space consumption thereof relative to vertical surface mount packages, horizontally mountable semiconductor devices and packages, and many other multi-chip modules is reduced. Further, fabrication of the semiconductor devices requires no substantial additional steps relative to the fabrication of many similar semiconductor devices in the prior art. Assemblies including the inventive back-to-back semiconductor device module and an alignment device or a clip-on lead are also user-upgradable.

Although the foregoing description contains many specificities, these should not be construed as limiting the scope of the present invention, but merely as providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein which fall within the meaning and scope of the claims are to be embraced within their scope.

What is claimed is:

1. A semiconductor device assembly, comprising:
   a first semiconductor device including a first active surface bearing a plurality of contact pads, a peripheral edge, and a first back side opposite said first active surface;
   a second semiconductor device including a second active surface bearing a plurality of contact pads, a peripheral edge, and a second back side opposite said second active surface, said second back side secured to said first back side, said peripheral edges of said first and second semiconductor devices defining a mutual peripheral edge of the semiconductor device assembly, each contact pad of said pluralities of contact pads of said first and second semiconductor devices being disposed adjacent a single mutual peripheral edge of the semiconductor device assembly so as to facilitate mounting of the semiconductor device assembly in nonparallel relation to a carrier substrate, and
   at least one support joint positionable between at least one contact pad of said plurality of contact pads of at least one of said first and second semiconductor devices and a corresponding contact on the carrier substrate for interconnecting at least one of said first and second semiconductor devices to the carrier substrate, wherein at least one solder bump is disposed on at least one said contact pad for electrically connecting at least said first and second semiconductor devices to at least one said support joint.

2. The semiconductor device assembly of claim 1, further comprising an intervening securing element disposed between said first semiconductor device and said second semiconductor device.

3. The semiconductor device assembly of claim 2, wherein said securing element comprises a thermally conductive material.

4. A semiconductor device assembly of claim 1, wherein at least some of said plurality of contact pads of said first semiconductor device are each aligned with a contact pad of said plurality of contact pads of said second semiconductor device.

5. A semiconductor device assembly, comprising:
   a first semiconductor device having a first back side and
   a second semiconductor device having a second back side secured to said first back side to form the semiconductor device assembly;
   a plurality of contact pads disposed on exposed surfaces of said first and second semiconductor devices adjacent a single, mutual peripheral edge of the semiconductor device assembly so as to facilitate mounting of the semiconductor device assembly in nonparallel relation to said carrier substrate; and
   at least one support joint positionable between at least one contact pad of said plurality of contact pads of at least one of said first and second semiconductor devices and a corresponding contact on the carrier substrate for interconnecting at least one of said first and second semiconductor devices to the carrier substrate, wherein at least one solder bump is disposed on at least one said contact pad for electrically connecting at least said first and second semiconductor devices to at least one said support joint.

6. A semiconductor device assembly, comprising:

a first semiconductor device having a first back side and a second semiconductor device having a second back side secured to said first back side to form the semicondictor device assembly;

a plurality of contact pads disposed on exposed surfaces of said first and second semiconductor devices adjacent a single, mutual peripheral edge of the semiconductor device assembly so as to facilitate mounting of the semiconductor device assembly in nonparallel relation to said carrier substrate; and at least one support joint positionable between at least one contact pad of said plurality of contact pads of at least one of said first and second semiconductor devices and a corresponding contact on the carrier substrate for interconnecting at least one of said first and second semiconductor devices to the carrier substrate, wherein at least one solder bump is disposed on at least one said contact pad for electrically connecting at least said first and second semiconductor devices to at least one said support joint.

7. The assembly of claim 6, further comprising at least one assembly-securing element electronically attachable between a selected one of said plurality of contact pads and a terminal of a carrier substrate.

8. The assembly of claim 7, wherein said at least one assembly-securing element comprises a conductive joint.

9. The assembly of claim 7, wherein said at least one assembly-securing element further comprises an alignment device mountable to said carrier substrate and including a body which defines a downwardly extending receptacle in a top thereof that is configured to receive at least said single, mutual peripheral edge of the semiconductor device assembly.

10. The assembly of claim 9, wherein said alignment device further includes a plurality of conductive elements, selected ones of which are electrically attachable to said terminal and, upon insertion of the semiconductor device assembly into said receptacle, are disposed intermediate said termial and a corresponding contact pad, resiliently engage said corresponding contact pad, and establish an electrical connection between said corresponding contact pad and said terminal.

11. The assembly of claim 10, wherein upon interconnection of the semiconductor device assembly and said alignment device, said plurality of conductive elements secure the semiconductor device assmebly substantially perpendicular to said carrier substrate.

12. The assembly of claim 7, wherein said at least one assembly-securing element comprises a clip-on lead including laterally spaced leaf spring members and at least one terminal contact end extending therefrom.

13. The assembly of claim 12, wherein said at least one terminal contact end is electrically connectable to said terminal.

14. The assembly of claim 12, wherein upon insertion of the semiconductor device assembly between said leaf spring members, at least one of said leaf spring members biases against the semiconductor device assembly.

15. The assembly of claim 12, wherein upon insertion of the semiconductor device assembly between said leaf spring members, at least one of said leaf spring members resiliently engages a selected contact pad and establishes an electrical connection therewith.

16. The assembly of claim 12, wherein said leaf spring members are electrically insulated from one another.

17. A chip-on-board assembly, comprising:

a carrier substrate including a plurality of terminals;

a module oriented nonparallel to said carrier substrate and including a first semiconductor device having a first back side and a second semiconductor device having a second back side secured to said first back side, and a plurality of contact pads disposed adjacent a single, mutual peripheral edge of said module proximate to said carrier substrate so as to facilitate substantially nonparallel mounting of the semiconductor device assembly relative to a carrier substrate;

a plurality of conductive joints electrically connecting said terminals to corresponding ones of said plurality of contact pads; and at least one support joint positionable between at least one contact pad of said plurality of contact pads of at least one of said first and second semiconductor devices and a corresponding contact on the carrier substrate for interconnecting at least one of said first and second semiconductor devices to the carrier substrate, wherein at least one solder bump is disposed on at least one said contact pad for electrically connecting at least said first and second semiconductor devices to at least one said support joint.

18. The chip-on-board assembly of claim 17, further comprising support joints interconnecting said module and said carrier substrate.

19. An electronic system, comprising:

a carrier substrate;

a back-to-back semiconductor device module operatively associated with said carrier substrate and positioned thereon nonparallel thereto, said back-to-back semiconductor device module including two semiconductor devices, each including a plurality of bond pads disposed adjacent a single mutual peripheral edge of said back-to-back semiconductor device module; and at least one support joint positionable between at least one contact pad of said plurality of contact pads of at least one of said first and second semiconductor devices and a corresponding contact on the carrier substrate for interconnecting at least one of said first and second semiconductor devices to the carrier substrate, wherein at least one solder bump is disposed on at least one said contact pad for electrically connecting at least said first and second semiconductor devices to at least one said support joint.

20. The electronic system of claim 19, wherein said back-to-back semiconductor device module is oriented substantially perpendicular to said carrier substrate.

* * * * *

UNITED STATES PATENT AND TRADEMARK OFFICE
CERTIFICATE OF CORRECTION

PATENT NO.     : 6,380,630 B1
DATED           : April 30, 2002
INVENTOR(S)  : Larry D. Kinsman It is certified that error appears in the above-identified patent and that said Letters Patent is hereby corrected as shown below:

Column 9,
Line 54, delete the period after "substrate"

Column 10,
Line 32, change the comma after "substrate" to a semicolon
Lines 55-67, delete these lines in their entirety Column 11,
Lines 1-8, delete these lines in their entirety and insert therefor
-- 5.     A semiconductor device assembly, comprising:
a first semiconductor device including a first active
        surface with a plurality of contact pads thereon;
a second semiconductor device including a second
        active surface with a plurality of contact pads
        thereon, said first and second semiconductor
        devices disposed adjacent one another in back-
        to-back relation with said first and second
        active surfaces facing substantially opposite
        directions, edges of said first and second
        semiconductor devices mutually forming a
        peripheral edge of the semiconductor device
        assembly, each contact pad of said pluralities of
        contact pads of said first and second
        semiconductor devices being located adjacent a
        single mutual peripheral edge of the
        semiconductor device assembly so as to
        facilitate mounting of the semiconductor
        device assembly in nonparallel relation to a
        carrier substrate; and
at least one support joint positionable between at
        least one contact pad of said plurality of contact
        pads of at least one of said first and second
        semiconductor devices and a corresponding
        contact on the carrier substrate for
        interconnecting at least one of said first and
        second semiconductor devices to the carrier
        substrate, wherein at least one solder bump is
        disposed on at least one said contact pad for
        electrically connecting at least said first and
        second semiconductor devices to at least one
        said support joint. --

UNITED STATES PATENT AND TRADEMARK OFFICE
CERTIFICATE OF CORRECTION

PATENT NO.     : 6,380,630 B1
DATED          : April 30, 2002
INVENTOR(S)    : Larry D. Kinsman It is certified that error appears in the above-identified patent and that said Letters Patent is hereby corrected as shown below:

Column 11,
Line 12, change "semicondictor" to -- semiconductor --
Line 31, change "electronically" to -- electrically --
Line 48, change "termial" to -- terminal --
Line 55, change "assmebly" to -- assembly --

Column 12,
Line 51, change "contact" (both occurrences) to -- bond --
Lines 52 and 54, change "first and second" to -- two --
Line 57, change "contact" to -- bond -- and at the end of the line delete "first"
Line 58, change "and second" to -- two --

Signed and Sealed this

Twenty-first Day of October, 2003

JAMES E. ROGAN
*Director of the United States Patent and Trademark Office*